United States Patent [19]

Abraham

[11] Patent Number: 4,952,274

[45] Date of Patent: Aug. 28, 1990

[54] METHOD FOR PLANARIZING AN INSULATING LAYER

[75] Inventor: Thomas Abraham, Kanata, Ontario, Canada

[73] Assignee: Northern Telecom Limited, Montreal, Canada

[21] Appl. No.: 199,489

[22] Filed: May 27, 1988

[51] Int. Cl.$^5$ .................... B44C 1/22; C03C 15/00
[52] U.S. Cl. .................... 156/643; 156/647; 156/649; 156/653; 156/657; 156/662; 204/192.32; 204/192.37
[58] Field of Search ............ 156/643, 647, 649, 662, 156/653, 657; 204/192.1, 192.32, 192.37

[56] References Cited

U.S. PATENT DOCUMENTS

| | | | |
|---|---|---|---|
| 4,522,681 | 6/1985 | Gorowitz et al. | 156/643 |
| 4,676,868 | 6/1987 | Riley et al. | 156/653 |
| 4,676,869 | 6/1987 | Lee et al. | 156/653 |
| 4,758,306 | 7/1988 | Cronin et al. | 156/645 |

OTHER PUBLICATIONS

Y. Hazuki et al., A New Application of Rie to Planarization and Edge Rounding of SiO$_2$ Hole in the Al Multilevel Interconnection, VLSI Sep. 82.
Tom Abraham, Reactive Facet Tapering of Plasma Oxide for Multilevel Interconnect Applications, V-MIC Conf. Jun. 87.
E. J. McInerney, AN IN-SITU Planarized PECVD Silicon Dioxide Interlayer Dielectric, V-MIC Conf., Jun. 86.
G. E. Gimpelson et al., Plasma Planarization with a Non-Planar Sacrificial Layer, V-MIC Conf., Jun. 84.
T. Abraham, Sidewall Tapering of Plasma Etched Metal Interconnects, V-MIC Conf., Jun. 86.
Barbara Vasquez, Planarized Oxide with Sacrificial Photoresist: Etch Rate Sensitivity to Pattern Density, V-MIS Conf., Jun. 87.
H. Kotami et al., Sputter-Etching Planarization for Multilevel Metallization, J. Electrochem. Soc., p. 645, Mar. 1983.

*Primary Examiner*—David L. Lacey
*Assistant Examiner*—Lori Johnson
*Attorney, Agent, or Firm*—C. W. Junkin

[57] ABSTRACT

In a method for planarizing an insulating layer, the height of steps in a layer of insulating material are reduced while tapering side walls of the steps by forming a layer of sacrificial material between the steps and etching the insulating material and the sacrificial material in a low pressure plasma comprising reactive ions and facetting ions. This method combines many of the advantages of Resist Etch Back (REB) and argon facetting techniques while reducing the deleterious effects of macroloading and microloading.

19 Claims, 3 Drawing Sheets

METHOD FOR PLANARIZING AN INSULATING LAYER

FIELD OF THE INVENTION

This invention relates to a method for planarizing an insulating layer.

BACKGROUND OF THE INVENTION

Individual semiconductor devices in integrated circuits are interconnected by means of one or more patterned conductive layers overlying the semiconductor devices. It is particularly advantageous to provide a plurality of patterned conductive layers separated from one another and from the underlying semiconductor devices by a layer of insulating material. This practice permits a higher density of interconnections per unit area than can be provided by a single patterned conductive layer, and simplifies design by permitting interconnection paths implemented in one conductive layer to cross over interconnection paths implemented in other conductive layers.

Multilevel interconnection structures are made by alternately depositing and patterning layers of conducting material, typically aluminum alloys such as Al-Si, and layers of insulating material, typically $SiO_2$. The patterning of underlying layers defines a nonplanar topography which complicates reliable formation of overlying layers. In particular, the nonplanar topography of underlying conductive layers is replicated in overlying insulating layers to provide vertical steps in the insulating layers. Moreover, small holes are formed in the insulating layers to permit interconnection to underlying conductive layers or device contacts.

The subsequent formation of a conductive layers overlying the nonplanar topography of the insulating layers is complicated by thinning of the conductive layers at the tops of the steps, cusping or microcracking of the conductive layers at the bottoms of the steps, and formation of voids in the conductive layers in small via and contact holes. Moreover, uneven formation of the conductive layers reduces the resistance of the patterned conductive material to electromigration, reducing the reliability of the completed integrated circuit.

Patterning of the resulting conductive layers may also be complicated by the nonplanar topography. For example, conductive material at the bottom of steps is difficult to remove and may provide unwanted conductive paths between adjacent regions of a conductive layer.

The formation of further insulating layers is also complicated by the nonplanar topography of the conducting layers. Weaknesses are present in the insulating layers at the tops and bottoms of steps. Cracks form at such weaknesses, providing unwanted conductive paths between adjacent conductive layers.

The Resist Etch Back (REB) technique is frequently used to modify the nonplanar topography of insulating layers in an effort to minimize or avoid the above problems. In the REB technique, a thick layer of photoresist is formed on a nonplanar insulating layer and the photoresist is etched back until peaks or steps in the insulating layer topography are exposed, but valleys or troughs in the insulating layer topography are filled with remaining photoresist. The etching process is then controlled so that the etch rate of the insulating layer is substantially equal to the etch rate of the photoresist. Peaks or steps in the insulating layer topography are etched while valleys or troughs are protected by the photoresist, so the height of the peaks or steps is reduced.

While the REB technique reduces the height of peaks or steps in the insulating layer topography, it does not necessarily eliminate the sharp edges or vertical sidewalls of steps. These sharp edges and vertical sidewalls cause many of the problems referred to above, and such problems persist when the REB technique is used.

The REB technique is also subject to macroloading and microloading effects which can have a considerable impact on the results obtained in a production environment. The macroloading effect is a run to run or wafer to wafer variation of the relative etch rates of the insulating material and photoresist. Because the etch rates must be substantially equal to obtain an optimum reduction in step height, such variations cause a reduction in step height which is less than optimum. In severe cases, macroloading effects may actually accentuate deviations from a planar topography.

The microloading effect is enhanced localized etching of the photoresist in narrow valleys or troughs and at the edges of steps in the insulating layer. Microloading is primarily due to oxygen species liberated during etching of the insulating layer defining the side walls of the valleys, troughs or steps. The enhanced localized etching causes formation of sharp notches or trenches which in turn cause the problems referred to above.

The sharp edges and vertical side walls of steps and notches or trenches in the insulating layers can be avoided by ion milling the insulating layers in a low pressure inert gas plasma, typically an argon plasma. Because sputter ejection is favoured for ions which arrive at a specific angle to the surface of the insulating layer, the side walls of steps and notches or trenches are tapered at an angle corresponding to the favoured angle, and sharp edges are avoided in the resulting insulating layer topography.

While argon facetting techniques avoid sharp edges and vertical side walls in the insulating layers, they do not substantially reduce the height of steps and peaks in the insulating layer topography. Hence some of the patterning problems referred to above persist when argon facetting techniques are used.

SUMMARY OF THE INVENTION

It is an object of this invention to provide a method for planarizing an insulating layer which combines many of the advantages of the REB and argon facetting techniques.

In particular, it is an object of this invention to provide a method for planarizing an insulating layer which tapers sidewalls of steps in the insulating layer while reducing the height of such steps.

It is a further object of this invention to provide a method for planarizing an insulating layer which provides relatively satisfactory results when macroloading and microloading effects are present.

To these ends, this invention provides a method for reducing the height of steps in a layer of insulating material while tapering side walls of the steps, the method comprising forming a layer of sacrificial material between the steps, and etching the insulating material and the sacrificial material in a low pressure plasma comprising reactive ions and facetting ions.

The layer of sacrificial material may be formed with a thickness substantially equal to the height of the steps by forming a layer of sacrificial material having a substantially planar upper surface overlying the entire layer of insulating material, and uniformly removing sacrificial material from the substantially planar upper surface to expose upper surfaces of the steps, preferably by reactive ion etching the sacrificial material.

The insulating material, preferably $SiO_2$, and the sacrificial material, preferably photoresist, may be etched in a mixture of reactive gas ions comprising ions of $O_2$ and $CHF_3$, and inert gas ions with facetting properties, like Ar. The proportions of the ion gas mixture may advantageously be selected to etch the sacrificial material approximately 25% faster than the insulating material.

Because sacrificial material is provided between the steps, the etching reduces the step height as in REB techniques. Because the etching is carried out at low pressure and in the presence of facetting ions, the side walls of any remaining steps are tapered so as to avoid sharp edges in the resulting insulating layer topography, as in argon facetting techniques. Moreover, because the etching is carried out at low pressure and in the presence of facetting ions, the side walls of any steps or trenches resulting from macroloading or microloading effects are also tapered to avoid sharp edges. This has considerable practical benefits in a production environment. Consequently, the method according to the invention combines many of the advantages of REB and argon facetting techniques while reducing the deleterious effects of macroloading and microloading.

BRIEF DESCRIPTION OF THE DRAWINGS

An embodiment of the invention will now be described, by way of example only, with reference to the accompanying drawings, in which.

DETAILED DESCRIPTION OF THE EMBODIMENT

The Resist Etch Back (REB) planarization method is illustrated in FIG. 1a to 1e.

Figure 1A:
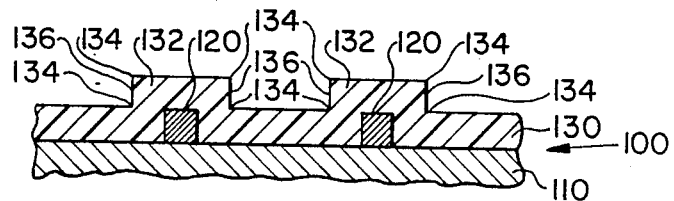
FIGS. 1a to 1e are cross-sectional views of a $SiO_2$ layer of an integrated circuit at successive steps in the performance of a Resist Etch Back (REB) planarization method.

Referring to FIG. 1a, a partially manufactured integrated circuit 100 comprises a substrate 110 including semiconductor devices (not shown) and a patterned layer of conductive material in the form of a pair of Al-Si tracks 120 on an upper surface of the substrate 110. A layer of insulating material in the form of a $SiO_2$ layer 130 overlies the substrate 110 and the Al-Si tracks 120, defining steps 132 over the Al-Si tracks 120.

The steps 132 have sharp edges 134 and substantially vertical side walls 136 which complicate the deposition and patterning of further Al-Si tracks overlying the $SiO_2$ layer 130 as discussed in some detail above.

Figure 1B:
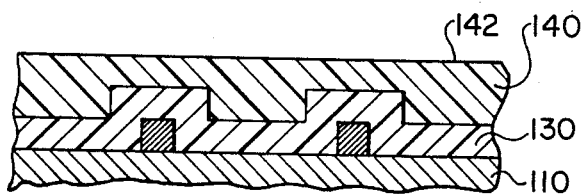
Figure 1C:
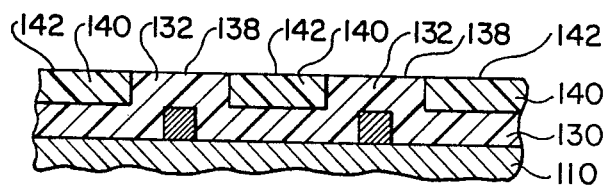

In the REB method, a layer 140 of photoresist having a substantially planar upper surface 142 is formed overlying the entire $SiO_2$ layer 130, as shown in FIG. 1b. The upper surface 142 of the photoresist layer 140 is uniformly etched back to expose upper surfaces 138 of the steps 132 in the $SiO_2$ layer 130, as shown in FIG. 1c.

Figure 1D:
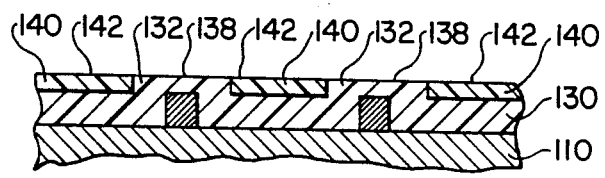

The upper surface 142 of the photoresist layer 140 and the upper surfaces 138 of the steps 132 are etched at substantially equal etch rates to reduce the height of the steps 132 as shown in FIG. 1d, the photoresist layer 140 between the steps 132 preventing etching of the $SiO_2$ layer 130 between the steps 132. Remaining portions of the photoresist layer 140 are removed as shown in FIG. 1e to complete the REB method.

Figure 1E:
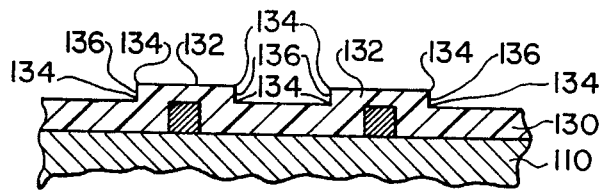

As shown in FIG. 1e, the REB method effectively reduces the height of steps 132 in the $SiO_2$ layer 130, but does not necessarily eliminate the sharp edges 134 and vertical sidewalls 136 of the steps 132. As these sharp edges 134 and vertical sidewalls 136 cause many of the problems referred to above, such problems persist when the REB technique is used. Also, as discussed above, the REB technique is subject to macroloading and microloading effects which can have considerable negative impact on results obtained in a production environment.

Figure 2A:
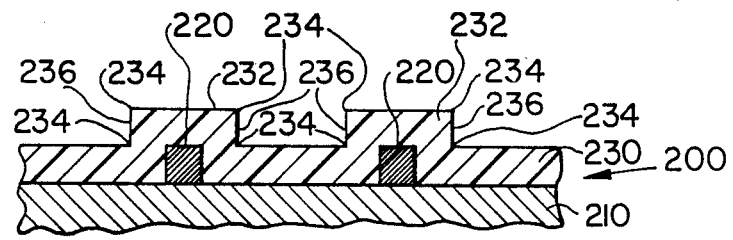
FIGS. 2a to 2c are cross-sectional views of a $SiO_2$ layer of an integrated circuit at successive steps in the performance of an argon facetting method.
Figure 2B:
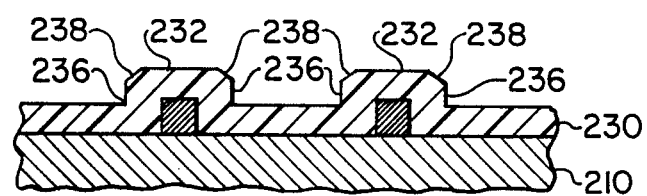
Figure 2C:
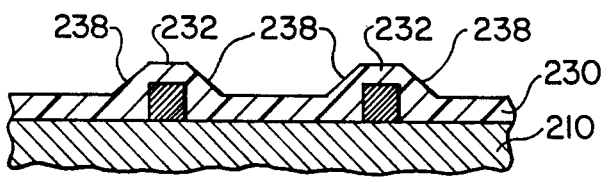

An argon facetting method is illustrated in FIGS. 2a to 2c.

Referring to FIG. 2a, a partially manufactured integrated circuit 200 similar to the partially manufactured integrated circuit 100 comprises a substrate 210 corresponding to the substrate 110, Al-Si tracks 220 corresponding to the Al-Si tracks 120 and a $SiO_2$ layer 230 corresponding to the $SiO_2$ layer 130.

The $SiO_2$ layer 230 defines steps 232 over the Al-Si tracks 220. The steps 232 have sharp edges 234 and substantially vertical side walls 236 which complicate the deposition and patterning of further Al-Si tracks overlying the $SiO_2$ layer 230 as discussed above.

In an argon facetting method, the $SiO_2$ layer 230 is exposed to a low pressure argon plasma which sputter etches the $SiO_2$ layer 230. Because sputter ejection is favoured for ions which arrive at a specific angle to the surface of the $SiO_2$ layer, angled facets 238 are formed in place of the sharp edges 234 of the steps 232, as shown in FIG. 2b. The angle of the facets 238 corresponds to the favoured angle for sputter ejection. The etching is continued until the facets 238 eliminate the sharp edges 234 and the vertical side walls 236 of the steps 232 as shown in FIG. 2c.

As shown in FIG. 2c, the argon facetting method effectively eliminates the sharp edges 234 and the vertical side walls 236 of the steps 232, but does not reduce the height of the steps 232. Hence some of the patterning problems referred to above persist when the argon facetting method is used.

A planarization method according to an embodiment of the invention is shown in FIGS. 3a to 3e.

Figure 3A:
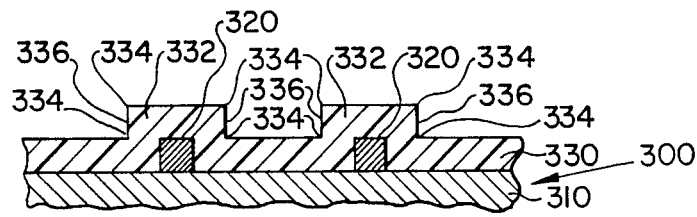
FIGS. 3a to 3e are cross-sectional views of a $SiO_2$ layer of an integrated circuit at successive steps in the performance of a planarization method according to the embodiment.

Referring to FIG. 3a, a partially manufactured integrated circuit 300 similar to the partially manufactured integrated circuits 100, 200 comprises a substrate 310 corresponding to the substrates 110,210, and Al-Si tracks 320 corresponding to the Al-Si tracks 120, 220.

A layer of insulating material in the form of a $SiO_2$ layer 330 corresponding to the $SiO_2$ layers 130, 230 overlies the substrate 310 and Al-Si tracks 320, defining steps 332 over the Al-Si tracks 320. The steps 332 have sharp edges 334 and substantially vertical side walls 336 which complicate the deposition and patterning of further Al-Si tracks overlying the $SiO_2$ layer 330 as discussed above.

Figure 3B:
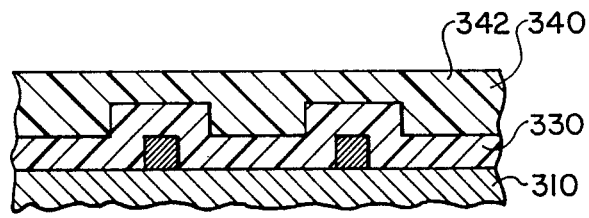

In the method according to the embodiment, a layer of sacrificial material in the form of a layer 340 of photoresist having a substantially planar upper surface 342 is formed overlying the entire SiO$_2$ layer 330, as shown in FIG. 3b.

Figure 3C:
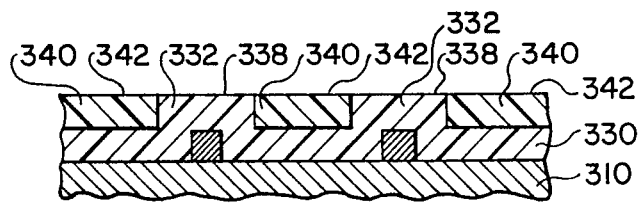

The partially completed integrated circuit 300 is inserted in an AME8110 Hex Reactive Ion Etcher and the upper surface 342 of the photoresist layer 340 is reactive ion etched in a gaseous ion flow comprising 25 sccm O$_2$, 15 sccm CHF$_3$ and 20 sccm Ar at a pressure of 15 mtorr and a power of 1100 watts to uniformly remove photoresist from the surface 342 until upper surfaces 338 of the steps 332 in the SiO$_2$ layer 300 are exposed and the photoresist layer 340, now having a thickness equal to the height of the steps 332, remains between the steps 332 as shown in FIG. 3c.

Figure 3D:
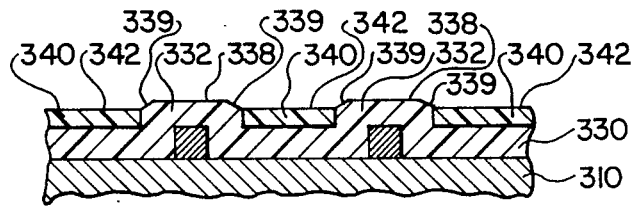

Reactive ion etching is continued without altering the operating parameters to etch the upper surface 342 of the photoresist layer 340 and the upper surfaces 338 of the steps 332. The proportions of O$_2$ and CHF$_3$ in the gaseous ion flow control the relative etch rates of the photoresist and the SiO$_2$. Reactive gases in the selected proportions (5 parts O$_2$ to 3 parts CHF$_3$) etch the photoresist approximately 25% faster than the SiO$_2$. Consequently, the SiO$_2$ steps 332 begin to protrude above the photoresist layer 340, as shown in FIG. 3d. Because sputter ejection is favoured for ions which arrive at a specific angle to the surface of the SiO$_2$ layer, angled facets 339 are formed in place of the sharp edges 334 of the steps 332 as the sharp edges begin to protrude above the photoresist layer 140 as shown in FIG. 3d. The angle of the facets 339 corresponds to the favoured angle for sputter ejection.

Figure 3E:
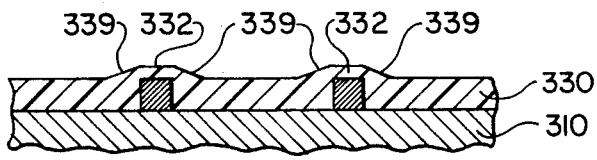

The reactive ion etching is continued without changing the operating parameters until the photoresist layer 340 is eliminated and the facets 339 eliminate the sharp edges 334 and the vertical side walls 336 of the steps 332, as shown in FIG. 3e. Before its elimination, the photoresist layer 340 between the steps 332 prevents etching of the SiO$_2$ layer 330 between the steps 332. As a result, the steps 332 are preferentially etched, so the height of the steps 332 is reduced while the side walls 336 are tapered. Thus, the method according to the embodiment combines advantages of the REB and argon facetting methods.

Moreover, because reactive ion etching is carried out at low pressure and in the presence of facetting ions in the method according to the embodiment, the side walls of any steps or trenches resulting from macroloading or microloading effects are also tapered to avoid sharp edges. This has considerable practical benefits in a production environment where these effects cannot easily be avoided. Consequently, the method according to the invention combines advantages of the REB and argon facetting methods while reducing the deleterious effects of macroloading and microloading.

Modifications of the method described above will be apparent to skilled practitioners and are within the scope of the invention as claimed below.

For example, the method could be practiced on layers of insulating material other than SiO$_2$, and sacrificial materials other than photoresist could be used with a suitable choice of reactive gases and operating parameters.

The layer of sacrificial material between the steps in the layer of insulating material could be thinner than the height of the steps with a suitable adjustment in the relative etch rates.

For the method as practiced on an SiO$_2$ layer with a photoresist sacrificial layer, the operating parameters could be modified. For example, the reactive ion etcher could be operated at a power between approximately 900 watts and approximately 1300 watts and at a pressure between approximately 8 mtorr and 20 mtorr without jeopardizing the collimated flow of ions required for tapering of the SiO$_2$ steps. Reactive gas ions other than O$_2$ and CHF$_3$ and inert gas ions other than Ar could be used, and the proportions of the reactive gases could be modified to etch the photoresist up to 50% faster than the SiO$_2$. The proportion of Ar could be between 3 parts and 8 parts per 5 parts O$_2$ and 3 parts CHF$_3$.

While the method according to the embodiment is performed in an AME8110 Hex Reactive Ion Etcher, it could be performed in other similar equipment, including magnetron single wafer systems with minor parameter modifications.

I claim:

1. A method for reducing the height of steps in a layer of insulating material while tapering side walls of the steps, the method comprising:
    forming a layer of sacrificial material between the steps; and
    etching the insulating material and the sacrificial material in a plasma comprising reactive ions and facetting ions at a pressure between 8 mtorr and 20 mtorr.

2. A method as defined in claim 1, comprising forming the layer of sacrificial material with a thickness substantially equal to the height of the steps.

3. A method as defined in claim 2, comprising forming the layer of sacrificial material between the steps by:
    forming a layer of sacrificial material having a substantially planar upper surface overlying the entire layer of insulating material; and
    uniformly removing sacrificial material from the substantially planar upper surface to expose upper surfaces of the steps.

4. A method as defined in claim 3, comprising uniformly removing material from the substantially planar upper surface by etching the upper surface.

5. A method as defined in claim 4, comprising uniformly removing material from the substantially planar upper surface by reactive ion etching.

6. A method as defined in claim 1, comprising etching the sacrificial material faster than the insulating material.

7. A method as defined in claim 6, comprising etching the sacrificial material up to 50% faster than the insulating material.

8. A method as defined in claim 7, comprising etching the sacrificial material 25% faster than the insulating material.

9. A method as defined in claim 1, wherein the facetting ions comprise inert gas ions.

10. A method for reducing the height of steps in a layer of SiO$_2$ while tapering side walls of the steps, the method comprising:
    forming a layer of photoresist between the steps; and
    etching the SiO$_2$ and the photoresist in a plasma comprising reactive ions and inert gas facetting ions at a pressure between 8 mtorr and 20 mtorr.

11. A method as defined in claim 10, comprising forming the layer of photoresist between the steps by:
    forming a layer of photoresist having a substantially planar upper surface overlying the entire layer of SiO$_2$; and
    uniformly etching the substantially planar upper surface to expose upper surfaces of the steps.

12. A method as defined in claim 11, comprising uniformly removing material from the substantially planar upper surface by reactive ion etching.

13. A method as defined in claim 12, comprising etching the photoresist up to 50% faster than the $SiO_2$.

14. A method as defined in claim 13, comprising etching the photoresist 25% faster than the $SiO_2$.

15. A method as defined in claim 10, wherein the reactive ions comprise ions of $O_2$ and $CHF_3$, and the inert gas facetting ions comprise ions of Ar.

16. A method as defined in claim 15, comprising etching the photoresist and $SiO_2$ in a mixture comprising 5 parts $O_2$, 3 parts $CHF_3$ and 3 to 8 parts Ar.

17. A method for reducing the height of steps in a layer of $SiO_2$ while tapering side walls of the steps, the method comprising:
    forming a layer of photoresist between the steps; and
    etching the $SiO_2$ and the photoresist in a mixture comprising 5 part $O_2$, 3 parts $CHF_3$ and 3 to 8 parts Ar at a pressure between 8 mtorr and 20 mtorr, and a power between 900 watts and 1300 watts.

18. A method for reducing the height of steps in a layer of $SiO_2$ while tapering side walls of the steps, the method comprising:
    forming a layer of photoresist between the steps; and
    reactive ion etching the $SiO_2$ and the photoresist in a mixture comprising 5 parts $O_2$, 3 parts $CHF_3$ and 4 parts Ar at a pressure of 15 mtorr and a power of 1100 watts.

19. A method for reducing the height of steps in a layer of $SiO_2$ while tapering side walls of the steps, the method comprising:
    forming a layer of photoresist between the steps; and
    reactive ion etching the $SiO_2$ and the photoresist in a gaseous flow comprising 25 sccm $O_2$, 15 sccm $CHF_3$ and 20 sccm Ar at a pressure of 15 mtorr and a power of 1100 watts.

* * * * *